(12) United States Patent
Okihara

(10) Patent No.: US 9,978,783 B2
(45) Date of Patent: May 22, 2018

(54) SEMICONDUCTOR DEVICE AND MANUFACTURING METHOD OF SEMICONDUCTOR DEVICE

(71) Applicant: LAPIS Semiconductor Co., Ltd., Yokohama (JP)

(72) Inventor: Masao Okihara, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days. days.

(21) Appl. No.: 15/599,040

(22) Filed: May 18, 2017

(65) Prior Publication Data

US 2017/0338256 A1    Nov. 23, 2017

(30) Foreign Application Priority Data

May 19, 2016 (JP) ................. 2016-100782

(51) Int. Cl.
| H01L 27/14 | (2006.01) |
| H01L 27/144 | (2006.01) |
| H01L 31/0216 | (2014.01) |
| H01L 31/103 | (2006.01) |

(52) U.S. Cl.
CPC .... *H01L 27/1443* (2013.01); *H01L 31/02165* (2013.01); *H01L 31/103* (2013.01)

(58) Field of Classification Search
CPC .......... H01L 27/1443; H01L 31/02165; H01L 31/103
See application file for complete search history.

(56) References Cited

U.S. PATENT DOCUMENTS 7,132,668 B2 * 11/2006 Vispute ........... H01L 31/022408
250/372

FOREIGN PATENT DOCUMENTS

| JP | 2008-251709 A | 10/2008 |
| WO | WO-2012/137539 A1 | 10/2012 |

* cited by examiner

*Primary Examiner* — Roy Potter
*Assistant Examiner* — Paul Patton
(74) *Attorney, Agent, or Firm* — Rabin & Berdo, P.C.

(57) ABSTRACT

A semiconductor device includes first and second photo-electric conversion elements, each having a light-receiving surface, disposed adjacent to each other, each outputting a light current that is a current corresponding to an intensity of received light, a first filter disposed on the light-receiving surface of the first photo-electric conversion element, a second filter disposed on the light-receiving surface of the second photo-electric conversion element, and a third filter disposed on the light-receiving surface of the second photo-electric conversion element and being in contact with the second filter, one end of the second filter and one end of the third filter overlapping one end of the first filter at a vicinity of a boundary between the first photo-electric conversion element and the second photo-electric conversion element.

12 Claims, 15 Drawing Sheets

FIG. 7

| FILTER | FIRST EMBODIMENT | SECOND EMBODIMENT | THIRD EMBODIMENT | FOURTH EMBODIMENT |
|---|---|---|---|---|
| FIRST FILTER 30A | PB CUT | PB CUT | UV-A CUT | UV-A CUT |
| SECOND FILTER 30B | PB CUT | UV-A CUT | UV-A CUT | PB CUT |
| THIRD FILTER 32 | UV-A CUT | PB CUT | PB CUT | UV-A CUT |

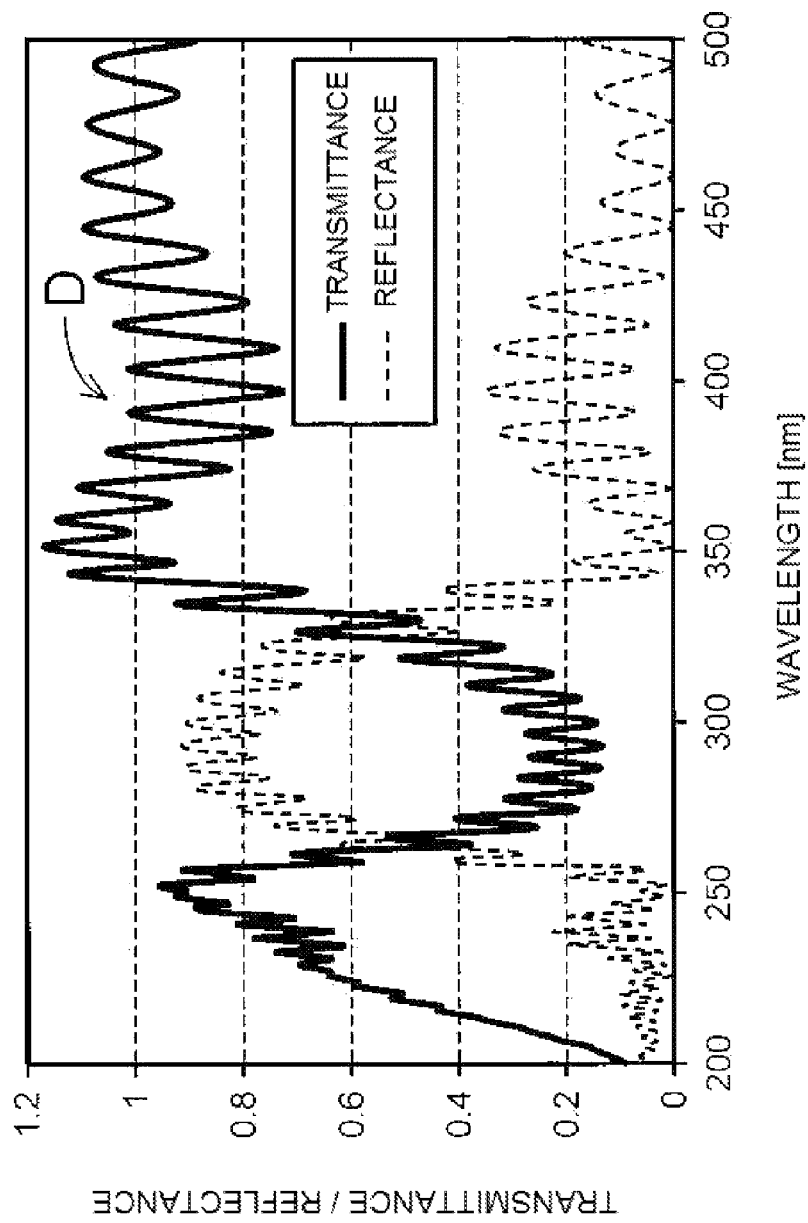

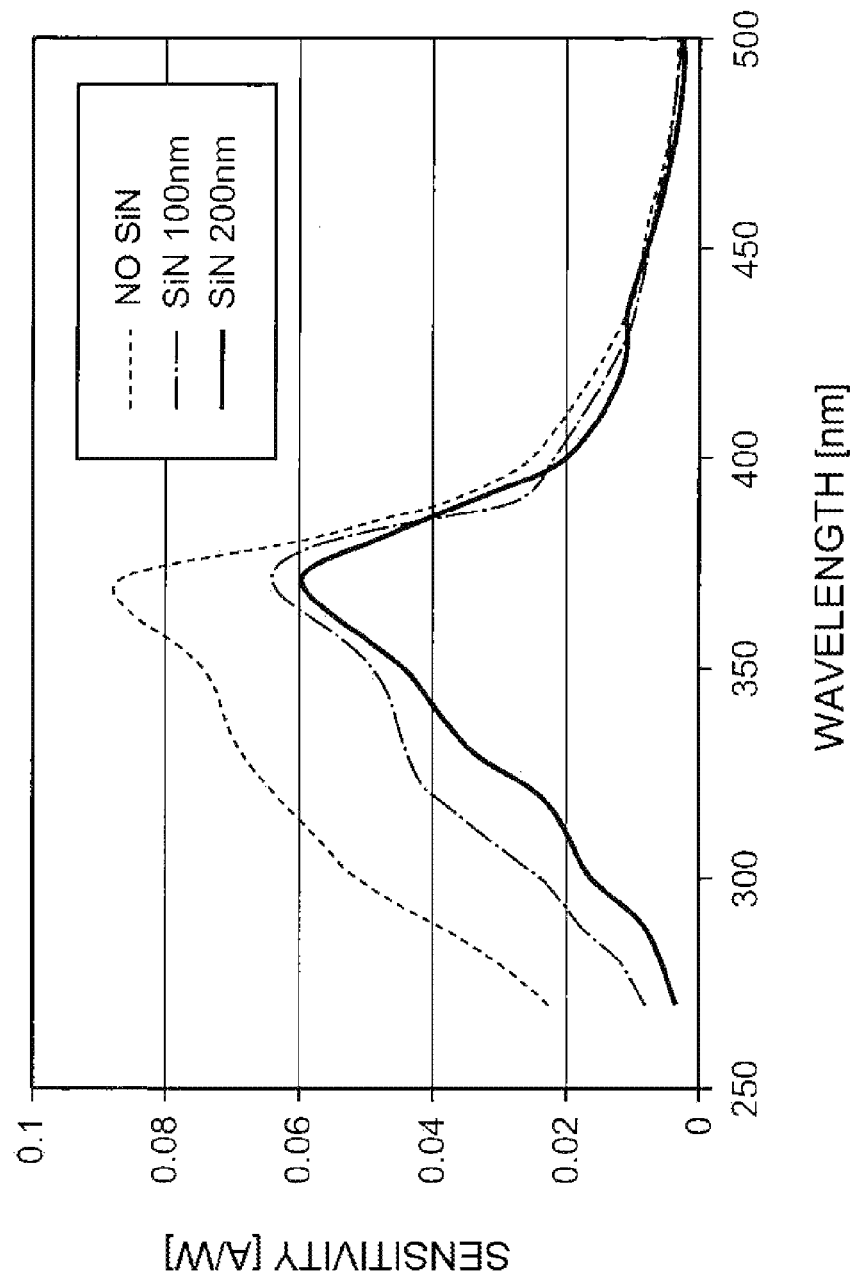

SEMICONDUCTOR DEVICE AND MANUFACTURING METHOD OF SEMICONDUCTOR DEVICE

TECHNICAL FIELD

The present invention relates to a semiconductor device and a manufacturing method for a semiconductor device.

BACKGROUND ARTS

As the ozone deletion causes more UV radiation to reach the earth's surface, the effect of UV light included in the sunlight on a human body and environment is becoming a greater concern.

The three types of UV radiation are classified as follows: long-wavelength ultraviolet light (UV-A: wavelength approximately 320 nm to 400 nm); medium-wavelength ultraviolet light (UV-B: wavelength approximately 280 nm to 320 nm); and short-wavelength ultraviolet light (UV-C: wavelength approximately 280 nm or shorter), and the effect on a human body and environment differs depending on the wavelength. UV-A can penetrate into the deeper layers of the skin and is responsible for the immediate tanning effect. It also contributes to skin aging. UV-B is responsible for skin burning, and promotes the development of skin cancer. UV-C has a strong bactericidal effect, but it is almost completely filtered by the ozone layer and little reaches the earth's surface.

It has been significantly important to immediately detect the amount of daily UV radiation in order to protect a human body, and the UV index, which functions as an indicator of the UV radiation amount, was introduced in 1995. The UV index indicates a relative degree of impact on a human body, and can be calculated using the CIE action spectrum, which was defined by CIE (Commission Internationale de l'Eclairage).

Against this background, there is a strong demand for a technique to accurately detect the radiation amount of UV-A and UV-B, respectively, included in the ultraviolet light. There is also a stronger demand for a technique to measure the UV radiation amount that can detect the radiation amount of UV-B and the total amount of UV-A and UV-B at the same time.

Japanese Patent Application Laid-open Publication No. 2008-251709 (Patent Document 1) discloses a UV light receiving element in which the first filter that allows UV-A, UV-B and visible light through is disposed on the first photo-diode, and the second filter that allows UV-A and visible light through is disposed on the second photo-diode. With this configuration, it is possible to separately detect the radiation amount of UV-A and the radiation amount of UV-B based on the radiation amount detected by the first photo-diode and the radiation amount detected by the second photo-diode. In the UV light receiving element disclosed in Patent Document 1, a difference in the light absorbing property between the first filter and second filter is determined by the amount of hydrogen contained in a silicon nitrogen film included in each filter.

WO 2012/137539 Pamphlet (Patent Document 2) discloses a UV light sensor in which a protective film and a filter film are stacked on a photo-diode. The protective film has a high light transmittance in the wavelength range of UV-A and UV-B, and the filter film is made of a multi-layer film formed by alternately stacking a low refractive index material and a high refractive index material and having a high light transmittance in the wavelength range of UV-A and UV-B, the filter film also having the filter property that can block UV-C and visible light.

SUMMARY OF THE INVENTION

However, the inventor of the present invention has proved that it is difficult to accurately detect the radiation amount of UV-B with the UV light receiving element disclosed in Patent Document 1 described above because the radiation amount of UV-A is generally much higher than the radiation amount of UV-B in UV light included in sunlight. Furthermore, the UV light receiving element disclosed in Patent Document 1 is not effective to accurately detect the radiation amount of UV-B because visible light is detected by the photo-diode.

The problem of the UV light receiving element above will be explained in detail with reference to FIG. 11. FIG. 11 is a graph showing the spectral response of a photo-diode when a filter made of a single layer of silicon nitride is disposed on the photo-diode. This graph was obtained by the inventor of the present invention. FIG. 11 shows the spectral response for respective photo-diodes with a 100 nm-thick silicon nitride film (SiN), a 200 nm-thick silicon nitride film, and no silicon nitride film.

As shown in FIG. 11, by forming the filter film made of a single layer of silicon nitride, not only the response to UV-B (wavelength of approximately 280 nm to 320 nm), the response to UV-A (wavelength of approximately 320 nm to 400 nm) is also lowered. Thus, it is not possible to accurately calculate the radiation amount of UV-B by simply obtaining the difference between the two. As described above, the filter film made of a single layer of silicon nitride cannot provide a sufficient wavelength selectivity for UV-A and UV-B, and therefore, it is difficult to properly separate UV-A from UV-B. This makes it very difficult to accurately detect the radiation amount of UV-B, little of which exists in sunlight.

The filter film in the UV sensor disclosed in Patent Document 2, which is formed by alternately stacking a low refractive index material and a high refractive index material, has a problem of not being able to exhibit a desired filter property because when the film thickness of the uppermost layer of the filter film changes, the filter property of the refractive material of the uppermost layer changes, which causes a standing wave in the stacked refractive materials.

Also, in order to form a filter film that blocks the first wavelength range and the second wavelength range by stacking the first filter film made of a multiple layers and blocking the first wavelength range, and the second filter film made of a multiple layers and blocking the second wavelength range, the first filter film and the second filter film need to be formed continuously. That is, in a two-step manufacturing process of forming the second filter film on the first filter film, if the first filter film is exposed to the atmosphere after the manufacturing process of the first filter film, for example, the organic material attached to the surface of the first filter film hinders or accelerates the growth of the refractive material of the second filter on the first filter film. This would change the filter property, which depends on the thickness of the refractive material, and a standing wave is generated in the stacked refractive material. In a case of a filter film that contains metal, if the first filter film is left in the atmosphere after the manufacturing process of the first filter film, the material of the surface of the first filter film is oxidized, which would change the filter property of the refractive material of the uppermost layer, and as a result, a standing wave is generated in the stacked refractive material. Thus, even with the UV sensor disclosed in Patent Document 2, it is difficult to appropriately separate UV-A from UV-B, and accurately detect UV-B.

The present invention was made in order to solve the above-mentioned problems, and is aiming at providing a semiconductor device that can separate UV-A from UV-B more appropriately and detect the radiation amount of UV-B more accurately, and a manufacturing method of such a semiconductor device.

According to one aspect of the invention, a semiconductor device includes a first photo-electric conversion element and a second photo-electric conversion element disposed adjacent to each other, the first photo-electric conversion element and the second photo-electric conversion element each outputting a light current that is a current corresponding to an intensity of received light, each of the first and second photo-electric conversion elements having a light-receiving surface, a first filter disposed on the light-receiving surface of the first photo-electric conversion element, a second filter disposed on the light-receiving surface of the second photo-electric conversion element, and a third filter disposed on the light-receiving surface of the second photo-electric conversion element and being in contact with the second filter, one end of the second filter and one end of the third filter overlapping one end of the first filter at a vicinity of a boundary between the first photo-electric conversion element and the second photo-electric conversion element.

According to another aspect of the invention, a semiconductor device includes a first photo-electric conversion element and a second photo-electric conversion element, each having a light-receiving surface, disposed adjacent to each other, the first photo-electric conversion element and the second photo-electric conversion element each outputting a light current that is a current corresponding to an intensity of received light, a first filter disposed on the light-receiving surface of each of the first photo-electric conversion element and the second photo-electric conversion element, the first filter being configured to block light of a first wavelength range, and a second filter disposed on the first filter above the light-receiving surface of the second photo-electric conversion element, the second filter being configured to block light of a second wavelength range different from the first wavelength.

According to one aspect of the invention, a method of manufacturing a semiconductor device includes forming, on a substrate, a first photo-electric conversion element and a second photo-electric conversion element, each having a light-receiving surface, disposed adjacent to each other, the first photo-electric conversion element and the second photo-electric conversion element each outputting a light current that is a current corresponding to an intensity of received light, forming a first filter on the light-receiving surface of the first photo-electric conversion element, and forming a second filter and a third filter on the light-receiving surface of the second photo-electric conversion element such that one end of the second filter and one end of the third filter overlapping one end of the first filter at a boundary between the first photo-electric conversion element and the second photo-electric conversion element.

According to the present invention, it is possible to provide a semiconductor device that can separate UV-A from UV-B more appropriately and detect the radiation amount of UV-B more accurately, and a manufacturing method of such a semiconductor device.

BRIEF DESCRIPTION OF THE DRAWINGS

FIG. 7 is a diagram showing the combination of respective filter properties according to a modification example of Embodiment 1.

FIGS. 10B and 10C are graphs showing the transmittance and reflectance of the filter with respect to those of a comparison example.

FIG. 11 is a graph showing the spectral response of a UV sensor in which a filter made of a silicon nitride film is disposed on a photo-diode.

EMBODIMENTS OF THE INVENTION

Figure 1:
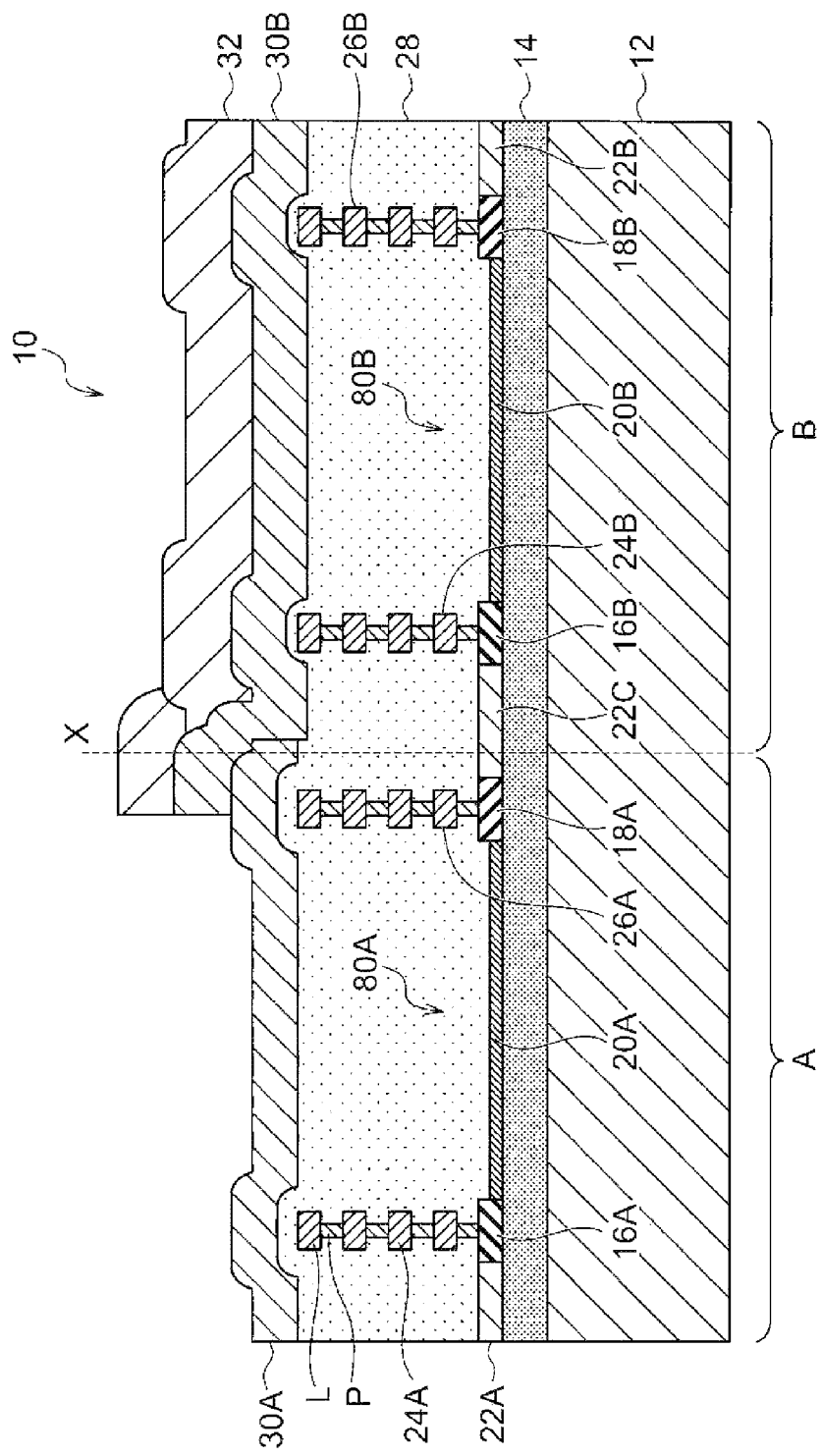
FIG. 1 is a vertical cross-sectional view showing an example of the configuration of a semiconductor device of Embodiment 1.

Below, embodiments of the present invention will be explained in detail with reference to figures.

Embodiment 1

A semiconductor device 10 of Embodiment 1 and a manufacturing method of the semiconductor device 10 will be explained with reference to FIGS. 1 to 7. The semiconductor device 10 is an embodiment in which the semiconductor device of the present invention is applied to a UV light receiving element, which is an example of the semiconductor device.

As described below, the semiconductor device 10 (UV light receiving element) includes a first photo-diode 80A and a second photo-diode 80B. Therefore, in the descriptions below, an area where the first photo-diode 80A is formed in the semiconductor device 10 will be referred to as the area A, and an area where the second photo-diode 80B is formed in the semiconductor device 10 will be referred to as the area B. Among the same constituting elements, the constituting elements primarily belonging to the area A will be denoted with A in the end of the respective reference characters, and the constituting elements primarily belonging to the area B will be denoted with B in the end of the respective reference characters.

The imaginary line X in FIG. 1 is a boundary line between the area A and the area B. As shown in FIG. 1, the semiconductor device 10 includes a substrate 12, a buried oxide film 14, the first photo-diode 80A, the second photo-diode 80B (will be collectively referred to as a photo-diode 80 where necessary), a P-side wiring layer 24A, an N-side wiring layer 26A, a P-side wiring layer 24B, an N-side wiring layer 26B, an interlayer insulating film 28, a first filter 30A, a second filter 30B, and a third filter 32. A first filter 30A is overlapped with the second and third filters 30B, 32 at a vicinity of the boundary between the area A and the area B.

In this embodiment, an SOI (silicon on insulator) substrate is used, for example, and the substrate 12 corresponds to an Si (silicon) substrate of the SOI substrate, the buried oxide film 14 corresponds to BOX, and a layer where the photo-diode 80 is formed corresponds to the silicon layer.

The first photo-diode 80A includes a P− diffusion layer 20A, a P+ diffusion layer 16A, an N+ diffusion layer 18A, and element separation regions 22A and 22C. The photo-diode 80A is a photo-electric conversion element that outputs a light current that is a current in accordance with the intensity of radiated UV light. That is, a lateral PN junction photo-diode is formed by the P+ diffusion layer 16A and the N+ diffusion layer 18A disposed to face each other, and the P− diffusion layer 20A disposed in contact with the P+ diffusion layer 16A and the N+ diffusion layer 18A.

The P+ diffusion layer 16A is formed by dispersing a P-type impurity in a silicon layer at a relatively high concentration, and forms the anode electrode of the first photo-diode 80A together with the P-side wiring layer 24A. On the other hand, the N+ diffusion layer 18A is formed by dispersing an N-type impurity in a silicon layer at a relatively high concentration, and forms the cathode electrode of the first photo-diode 80A together with the N-side wiring layer 26A.

The P− diffusion layer 20A is a primary light-receiving region in the first photo-diode 80A, and is formed by diffusing a P-type impurity in a silicon layer at a relatively low concentration. In the first photo-diode 80A, UV light is absorbed by a depletion layer formed in the P− diffusion layer 20A, thereby generating electron-hole pairs. By extracting those electron-hole pairs as a light current, the amount of UV light is measured (detected). The thickness of the P− diffusion layer 20A is smaller than those of the P+ diffusion layer 16A and the N+ diffusion layer 18A, and is set to 36 nm or thinner, for example. By setting the thickness of the P− diffusion layer 20A, which functions as the light-receiving region, to 36 nm or smaller, it is possible to lower the sensitivity of the first photo-diode 80A to light having a greater wavelength than those of UV-A and UV-B. As a result, the first photo-diode 80A has a desired spectral response as a UV sensor.

The element separation regions 22A and 22C are formed by an insulator such as a silicon oxide film ($SiO_2$ film), and are disposed to surround the first photo-diode 80A so that the photo-diode 80A is insulated from other elements such as the photo-diode 80B. The first photo-diode 80A and the second photo-diode 80B are disposed adjacent to each other across the element separation region 22C.

Each of the P-side wiring layer 24A and the N-side wiring layer 26A is a wiring layer including wiring L and contact plugs P, and connects the first photo-diode 80A to other circuit elements and wiring of the semiconductor device 10. FIG. 1 shows an example of four-layer wiring, but the present invention is not limited to this, and the number of wiring layers may be any number required by the semiconductor device 10.

The second photo-diode 80B includes a P− diffusion layer 20B, a P+ diffusion layer 16B, an N+ diffusion layer 18B, element separation regions 22B and 22C, a P-side wiring layer 24B, and an N-side wiring layer 26B. Similar to the first photo-diode 80A, the second photo-diode 80B is a photo-electric conversion element that outputs a light current in accordance with the intensity of radiated UV light. Thus, overlapping configurations are denoted with the same reference characters with B in the end, and the detailed descriptions thereof are omitted. In the descriptions below, the P-side wiring layer 24A, the N-side wiring layer 26A, the P-side wiring layer 24B, and the N-side wiring layer 26B may collectively be referred to as the "wiring layer". The element separation regions 22A, 22B, and 22C may collectively referred to as the "element separation region 22" as well.

The interlayer insulating film 28 is an insulating film formed to cover the first photo-diode 80A and the second photo-diode 80B, and is formed of an insulator such as a silicon oxide film. The P-side wiring layer 24A, the N-side wiring layer 26A, the P-side wiring layer 24B, and the N-side wiring layer 26B are respectively formed inside of this interlayer insulating film 28. The thickness of the interlayer insulating film 28 is approximately 4 µm in the case of four-layer wiring, for example.

The first filter 30A is formed at the top part of the first photo-diode 80A, or in other words, so as to cover the light-incident side of the first photo-diode 80A. The first filter 30A is an optical filter having the function of shielding visible light, but in the semiconductor device 10, the photo-diode 80 itself is configured to block light in a visible range having a longer wavelength than that of UV light. Therefore, the first filter 30A of this embodiment is configured to mainly block visible light of blue and violet wavelengths near the boundary area between UV light and visible light. This way, UV light and visible light can be separated more reliably. With the first filter 30A, the entire UV light (primarily UV-A and UV-B) enters the first photo-diode 80A. That is, the total amount of UV light is detected by the first photo-diode 80A. Below, blue and violet visible light will be referred to as "PB light," and an optical filter that cuts off the blue and violet visible light will be referred to as a "PB cut filter."

The second filter 30B and the third filter 32 are formed at the top part of the second photo-diode 80B, or in other words, so as to cover the light-incident side of the second photo-diode 80B. Similar to the first filter 30A, the second filter 30B is an optical filter having the function of blocking visible light. On the other hand, in this embodiment, the third filter 32 is a filter configured to block UV-A (UV-A cut filter). With the second filter 30B and the third filter 32, the second photo-diode 80B mainly receives UV-B of the entire UV light. That is, UV-B is detected by the second photo-diode 80B.

Figure 2:
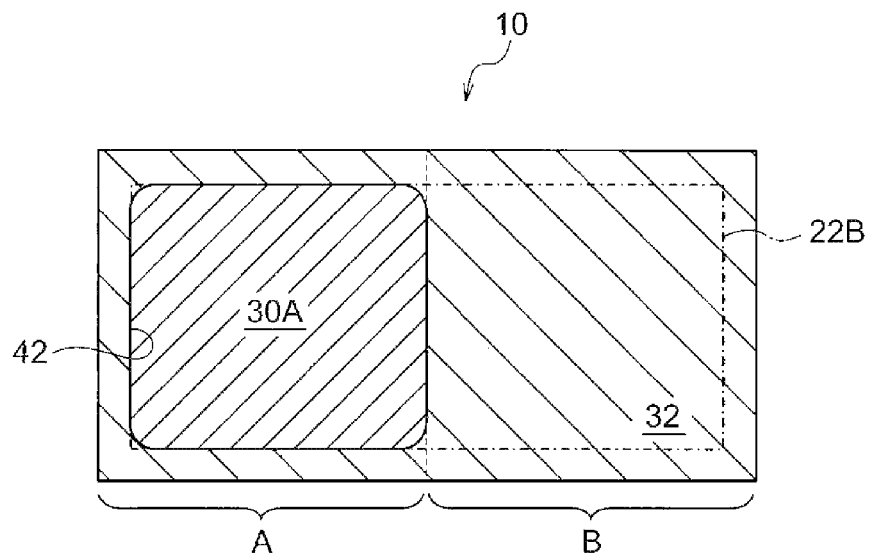
FIG. 2 is a plan view showing an example of the configuration of the semiconductor device of Embodiment 1.

FIG. 2 shows a plan view of the semiconductor device 10 of FIG. 1 when viewed from above. As shown in FIG. 2, an opening 42 is formed in the second filter 30B and the third filter 32 covering the semiconductor device 10, and through the opening 42, the first filter 30A is exposed.

Figure 3:
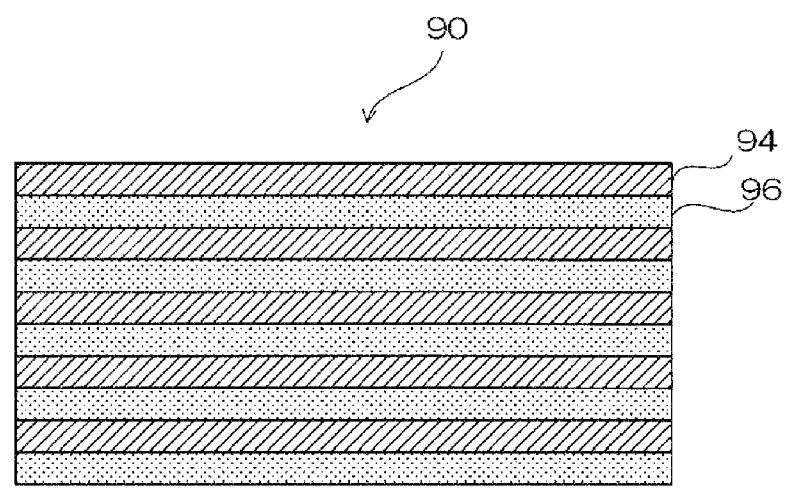
FIG. 3 is a vertical cross-sectional view showing an example of the configuration of a multi-layer filter in the semiconductor device of an embodiment.

Next, with reference to FIG. 3, the structures of the respective first filter 30A, the second filter 30B, and the third filter 32 of this embodiment (may collectively be referred to as the "filter group" below) will be explained in further detail. In this embodiment, each of the filter group is formed using a multi-layer film filter 90 shown in FIG. 3, for example. The multi-layer film filter 90 is an optical filter formed by alternatively laminating a high refractive index film 94, which has a relatively higher refractive index, and a low refractive index film 96, which has a relatively lower refractive index.

The high refractive index film 94 and the low refractive index film 96 are respectively configured so as to fulfill the following Formula 1 and Formula 2, where the refractive index of the high refractive index film 94 of the multi-layer film filter 90 is $n_1$, the film thickness thereof is $d_1$, the refractive index of the low refractive index film 96 is $n_2$, the film thickness thereof is $d_2$, and the median wavelength of the light to be blocked is $\lambda_C$:

$$n_1 \cdot d_1 = \lambda_C/4 \qquad \text{Formula 1}$$

$$n_2 \cdot d_2 = \lambda_C/4 \qquad \text{Formula 2}$$

By forming the multi-layer film filter 90 of a plurality of high-refractive index films 94 and low refractive index films 96 alternately laminated so as to fulfill Formula 1 and Formula 2 above, light reflected at the border between each layer is canceled out, and the transmittance of the light with the median wavelength $\lambda_C$ is reduced. That is, in the example of a UV-A cut filter designed to cut the light with the median wavelength of the UV-A wavelength range (approximately 360 nm, for example), UV-A that enters the multi-layer film filter 90 and is reflected at the boundary between the high refractive index film 94 and the low refractive index film 96 has the phase inverted, and is canceled out, while the intensity of UV-B, which travels in the direction of light transmittance, is enhanced as the phase is aligned. This way, the UV-A cut filter designed to cut the light with the median wavelength of the UV-A wavelength range can have the wavelength selectivity that allows UV-A through with the lower transmittance than that of UV-B. In other words, the UV-A cut filter can have the wavelength selectivity that keeps the transmittance of UV-A at a prescribed value or lower. A cut filter may have a plurality of median wavelengths $\lambda_C$ to be cut off, and in the case of UV-A cut filter, for example, the median wavelengths $\lambda_C$ may be set to 350 nm and 380 nm. The right hand side of Formula 1 and Formula 2 is not limited to $\lambda_C$, and may be an integral multiplication of $\lambda_C$.

As for the refractive index of the high refractive index film 94 and the low refractive index film 96, it is preferable that the difference in refractive index between the high refractive index film 94 and the low refractive index film 96 be at least 0.4, and the refractive index of the high refractive index film 94 be 2 or smaller. In view of this point, it is preferable to use a silicon nitride film ($Si_3N_4$) with the refractive index of about 1.8 for the material of the high refractive index film 94. Also, it is preferable to use a silicon oxide film with a refractive index of about 1.4 for the material of the low refractive index film 96. The high refractive index film 94 may be made of one or a mixture of tantalum oxide ($Ta_2O_5$), zirconium oxide ($ZrO_2$), titanium oxide ($TiO_2$), and lanthanum oxide ($La_2O_3$), for example. The low refractive index film 96 may be made of magnesium fluoride ($MgF_2$), silicon oxide ($SiO_2$), or a mixture of silicon oxide ($SiO_2$) and aluminum oxide ($Al_2O_3$).

For example, in the case of the first filter 30A and the second filter 30B, which are the PB cut filter, the thickness of the silicon nitride film (high refractive index film 94) is set to 60 nm, the thickness of the silicon oxide film (low refractive index film 96) is set to 75 nm, and five pairs to ten pairs are stacked. A pair is made up of one high refractive index film 94 and one low refractive index film 96, and the number of pairs means the number of the pair included in the multi-layer film filter 90. For example, FIG. 3 shows the case in which there are five pairs. On the other hand, in the case of the third filter 32, which is the UV-A cut filter, the thickness of the silicon nitride film (high refractive index film 94) is set to 40 nm, the thickness of the silicon oxide film (low refractive index film 96) is set to 50 nm, and five pairs to ten pairs are stacked.

In the embodiment described above, the high refractive index film was made of a silicon nitride film, for example, but the present invention is not limited to this, and a metal oxide film with a refractive index of about 1.8 to 2.2 may be used, for example.

Below, a manufacturing method of the semiconductor device 10 of this embodiment will be explained with reference to FIGS. 4 to 6. FIGS. 4 to 6 are vertical cross-sectional views showing an example of the manufacturing method of the semiconductor device 10. In this embodiment, a manufacturing method of the semiconductor device 10 using an SOI substrate will be explained as one example, but it is also possible to employ a manufacturing method that does not use an SOI substrate. Also, in the configuration described below, the wiring layer has a two-layer structure, for example. In this embodiment, when a layer is formed "above another layer" or "above a substrate", that means that the layer is formed on another layer or substrate not only directly, but also indirectly through the third layer.

First, an SOI substrate is prepared by forming a buried oxide film 14 (BOX) and a silicon layer 15 on a silicon substrate 12. In this embodiment, the silicon layer 15 is made of P-type silicon. Next, an ion injection process is conducted to inject a P-type impurity of a low concentration into a region A part of the silicon layer 15 corresponding to the P– diffusion layer 20A of the first photo-diode 80A and into a region B part of the silicon layer 15 corresponding to the P– diffusion layer 20B of the second photo-diode 80B.

Figure 4A:
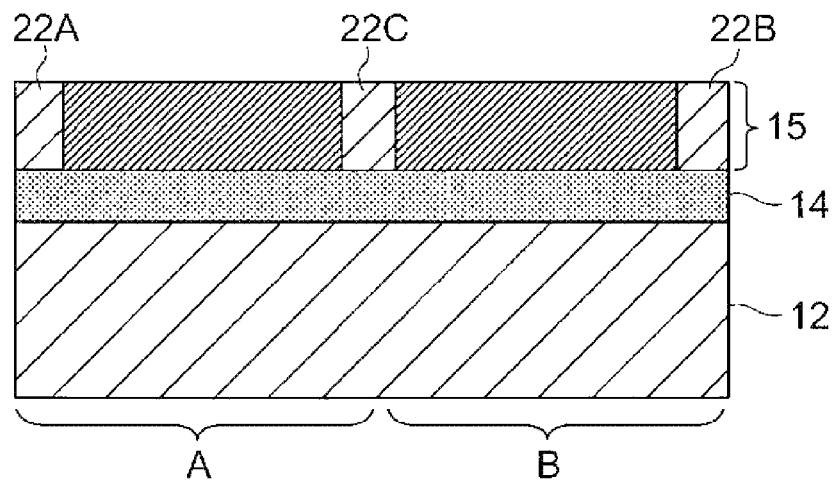
FIGS. 4A-4D are part of vertical cross-sectional views showing an example of a manufacturing process of the semiconductor device of Embodiment 1.

Next, as shown in FIG. 4A, the element separation regions 22 (element separation regions 22A, 22B, and 22C) are formed in the silicon layer 15 so as to surround the areas where the first photo-diode 80A and the second photo-diode 80B are to be formed. The element separation regions 22 can be formed using a known STI (shallow trench isolation) process, for example. The STI process includes a process to form a groove in the silicon layer 15 so as to reach the buried oxide film 14, a process to embed an insulator such as a silicon oxide film in this groove, and a process to remove unnecessary insulator deposited on the surface of the silicon layer 15 by CMP (chemical mechanical polishing). The element separation regions 22 may alternatively be formed by a known LOCOS method (Local Oxidation of Silicon).

Figure 4B:
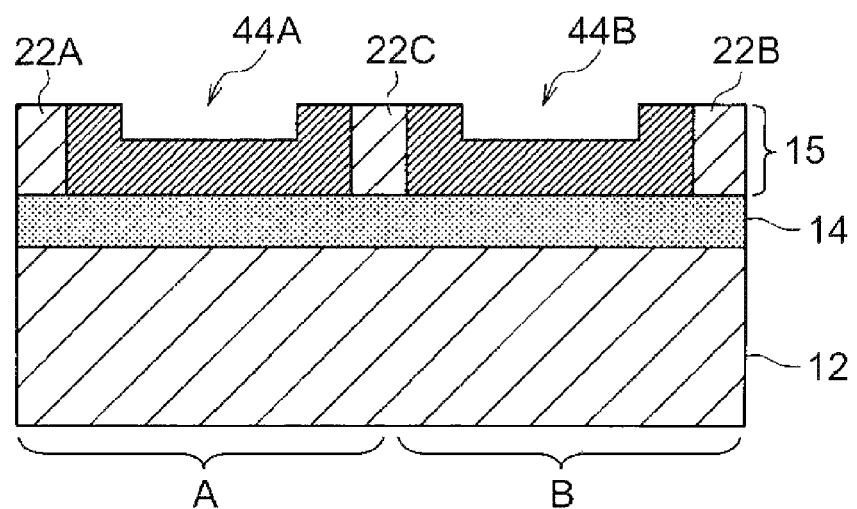

Next, as shown in FIG. 4B, parts of the silicon layer 15 are etched through photolithography and etching, thereby forming a recess 44A corresponding to the P– diffusion layer 20A of the first photo-diode 80A and a recess 44B corresponding to the P– diffusion layer 20B of the second photo-diode 80B. With this process, the thickness of the silicon layer 15 in the area corresponding to the P– diffusion layer 20A and the area corresponding to the P– diffusion layer 20B is reduced to approximately 36 nm. By setting the thickness of the areas corresponding to the P-diffusion layers 20A and 20B to 36 nm or smaller, the sensitivity of the first photo-diode 80A and the second photo-diode 80B to the light having a greater wavelength than that of UV light including UV-A and UV-B can be reduced, and as a result, a desired spectral response for a UV sensor can be achieved.

Figure 4C:
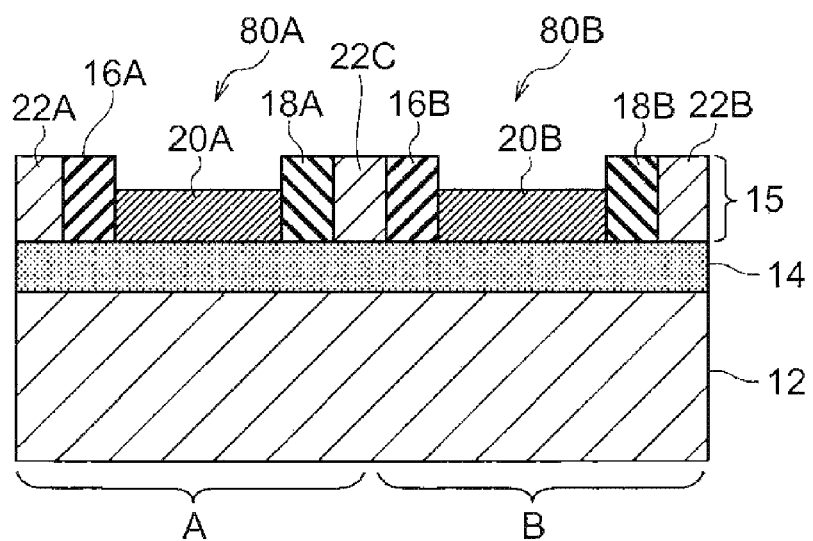

Next, as shown in FIG. 4C, a III group element such as boron-is injected into the silicon layer 15 by a known ion injection method, thereby forming the P+ diffusion layer 16A of the first photo-diode 80A and the P+ diffusion layer 16B of the second photo-diode 80B. Thereafter, a V group element such as phosphorus or arsenic is injected into the silicon layer 15 by a known ion injection method, thereby forming the N+ diffusion layer 18A of the first photodiode 80A and the N+ diffusion layer 18B of the second photo-diode 80B. In the first photo-diode 80A and the second photo-diode 80B, the P− diffusion layers 20A and 20B are formed in respective locations where the recesses 44A and 44B are formed, and the pair of P+ diffusion layer 16A and N+ diffusion layer 18A and the pair of P+ diffusion layer 16B and the N+ diffusion layer 18B are disposed so as to sandwich the respective P− diffusion layers 20A and 20B.

Figure 4D:
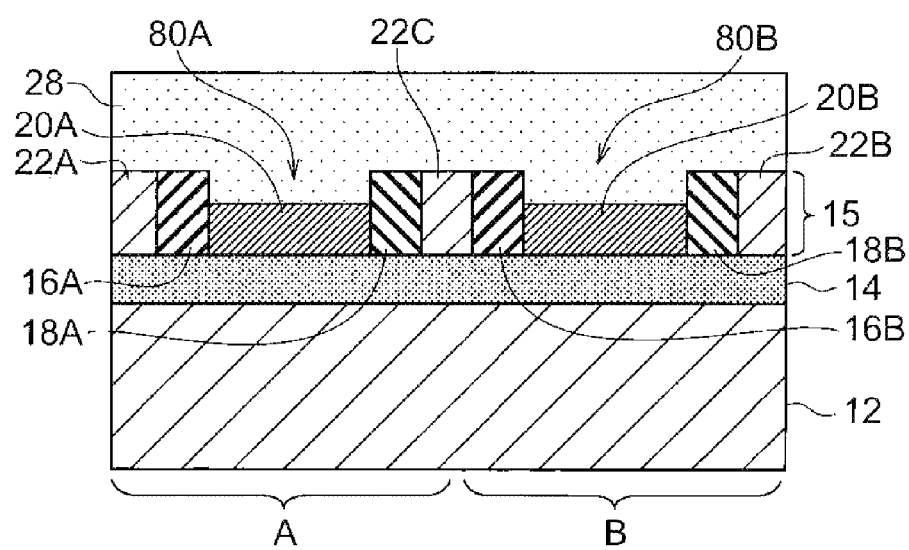

Next, as shown in FIG. 4D, an interlayer insulating film 28 made of an insulator such as a silicon oxide film is formed through the CVD method or the like on the surface of the silicon layer 15 on which the first photo-diode 80A and the second photo-diode 80B are formed.

Figure 5A:
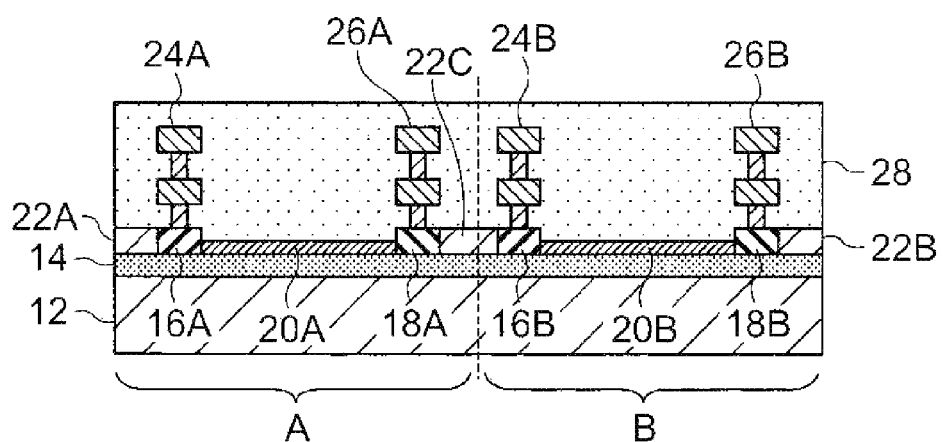
FIGS. 5A-5D are part of vertical cross-sectional views showing an example of the manufacturing process of the semiconductor device of Embodiment 1.

Next, via holes that penetrate the interlayer insulating film 28 and reach the P+ diffusion layers 16A and 16B and the N+ diffusion layers 18A and 18B are formed, and thereafter, a metal film is formed on the interlayer insulating film so as to fill the via holes. Then, the metal film is processed through the photolithography and etching so as to form the contact plug P and wiring line L. This process is repeated for the number of wiring layers, and as shown in FIG. 5A, the wiring layers, which are the P-side wiring layers 24A and 24B and the N-side wiring layers 26A and 26B are formed. In FIG. 5A, the wiring layer has a two-layer structure, for example, but the number of layers of the wiring layer is not limited to two, and may appropriately set to any number in accordance with the number of circuit elements of the semiconductor device 10 or the like. The thickness of the interlayer insulating film 28 is set to about 4 μm when the number of layers in the wiring layer is four, for example.

Figure 5B:
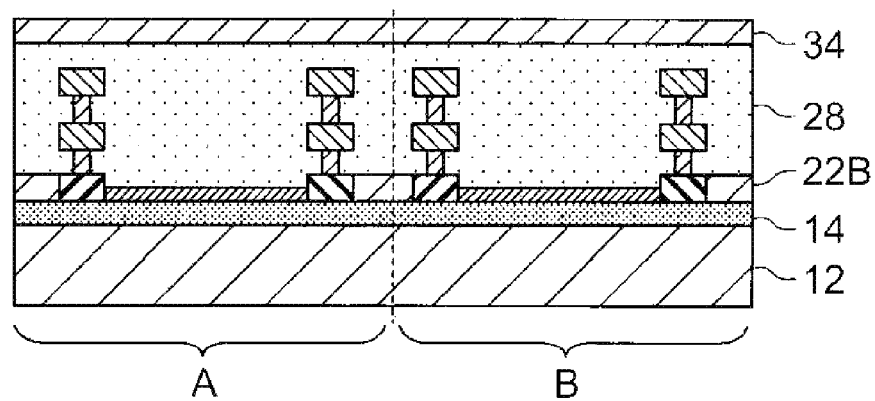

Next, as shown in FIG. 5B, a first filter film 34 for forming the first filter 30A, which is a PB cut filter, is formed on the interlayer insulating film 28. The first filter film 34 is formed by alternately laminating a high refractive index film and a low refractive index film (not shown in the figure). The high refractive index film may be a silicon nitride film formed by the plasm CVD method using silane ($SiH_4$) and ammonia ($NH_3$) as the material gas, for example. By controlling the flow volume of silane, the refractive index of the high refractive index film can be adjusted. The low refractive index film may be a silicon oxide film formed by the plasm CVD method using TEOS (tetraethylorthosillicate) and oxygen ($O_2$) as the material gas, for example. The refractive index of the low refractive index film made of a silicon oxide film is approximately 1.4.

More specifically, the high refractive index film and the low refractive index film are formed such that the thickness $d_1$ of the high refractive film and the thickness $d_2$ of the low refractive film fulfill Formula 1 and Formula 2 above, respectively, when the median wavelength $\lambda_C$ is set to the median wavelength of PB light. This way, it is possible to form the first filter film 34 having a wavelength selectivity that can keep the transmittance of the visible light at a prescribed value or lower.

Figure 5C:
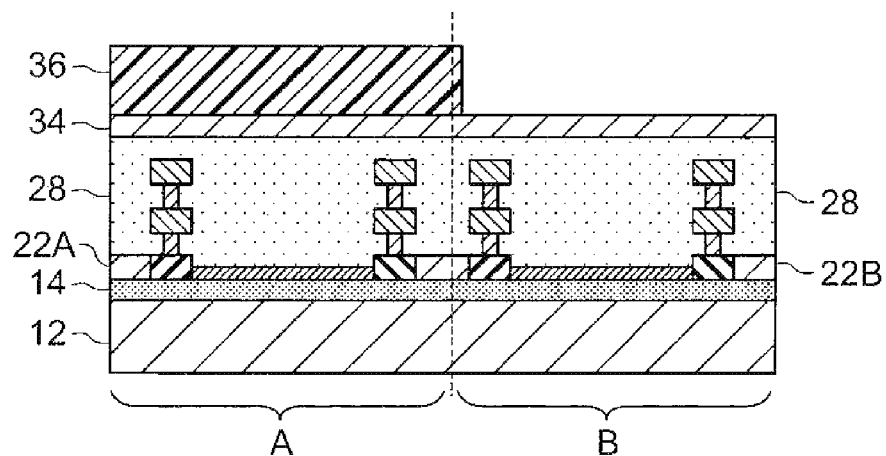

Next, as shown in FIG. 5C, the first filter film 34 is coated with a resist 36, and by conducting exposure and development processes, a mask is formed in the area A to mainly cover the first photo-diode 80A.

Figure 5D:
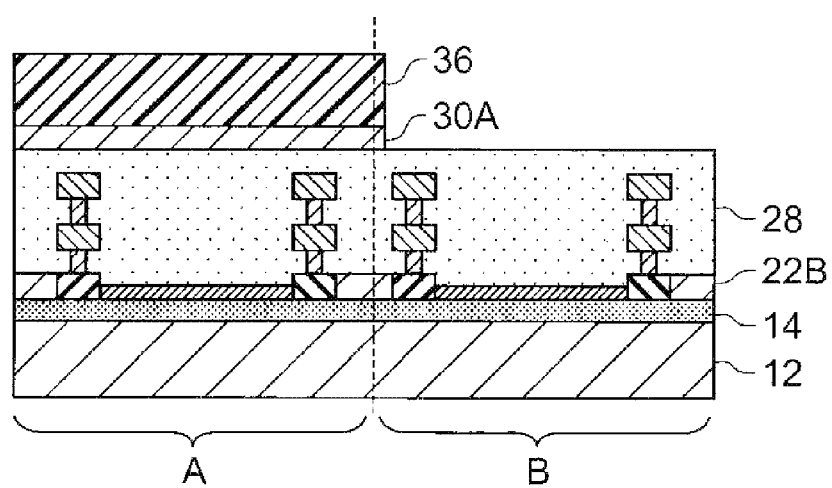
Figure 6A:
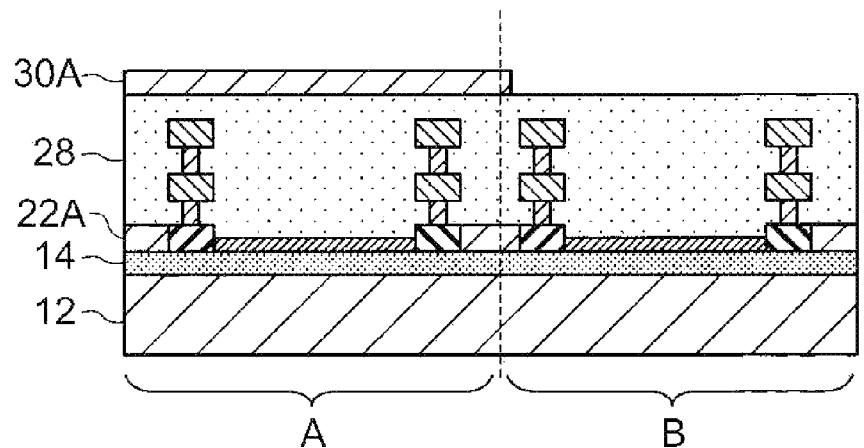
FIGS. 6A-6D are part of vertical cross-sectional views showing an example of the manufacturing process of the semiconductor device of Embodiment 1.

Next, as shown in FIG. 5D, a part of the first filter film 34 covering the second photo-diode 80B (in the area B) is removed by etching through the mask. Through this process, the first filter 30A is formed. Thereafter, as shown in FIG. 6A, the resist 36 is removed.

Figure 6B:
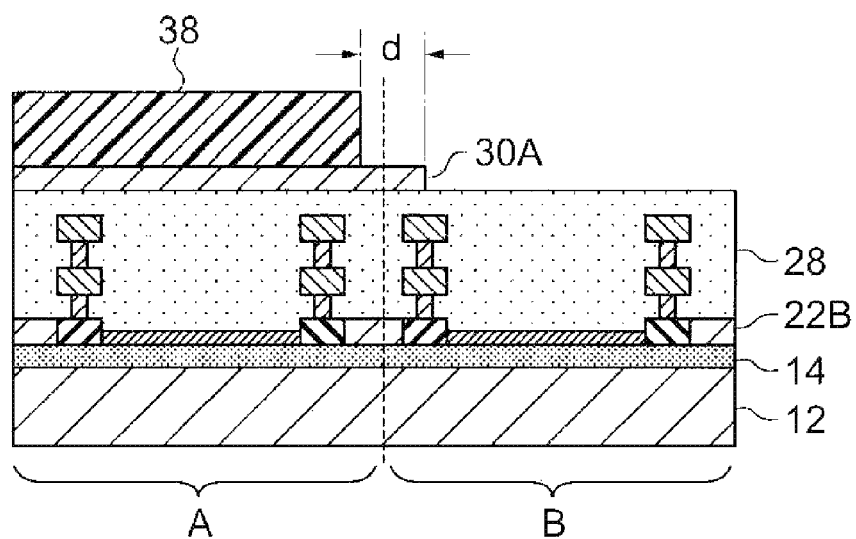

Next, the entire surface is coated with a resist 38, and by conducting exposure and development processes, a mask is formed in the area A to mainly cover the first photo-diode 80A as shown in FIG. 6B. In this process, as shown in FIG. 6B, the resist 38 is formed such that an end of the resist 38 goes back from the end of the first filter 30A by a prescribed distance d.

Figure 6C:
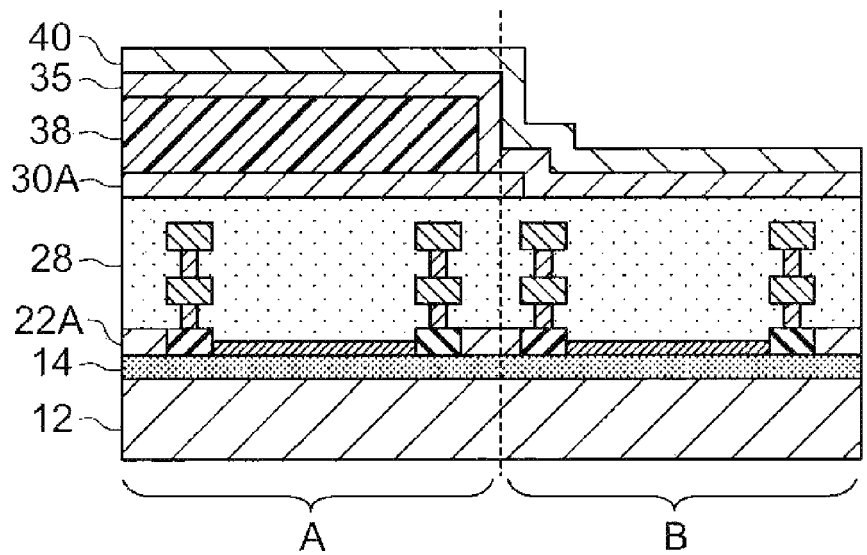

Next, as shown in FIG. 6C, the second filter film 35 for forming the second filter 30B, which is a PB cut filter, and the third filter film 40 for forming the third filter 32, which is a UV-A cut filter, are formed. In a manner similar to the first filter film 34, the second filter film 35 and the third filter film 40 are formed by alternately laminating a silicon nitride film, which is the high refractive index film, and a silicon oxide film, which is the low refractive index film (not shown in the figure). The forming method is the same as that of the first filter film 34, and therefore, the detailed description is omitted.

Figure 6D:
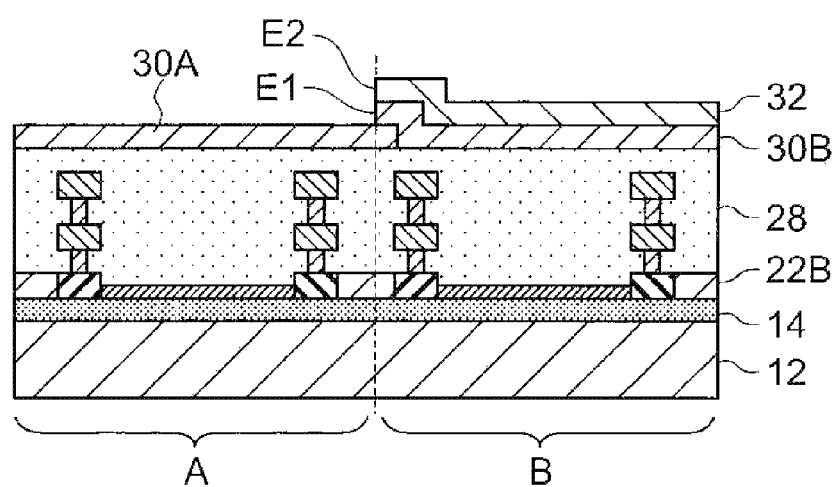

Next, as shown in FIG. 6D, the second filter film 35 and the third filter film 40 in the area A are removed. This removal process can be conducted by lift-off, for example. Through this process, the second filter 30B and the third filter 32 are formed. Due to the distanced described above, an end part E1 of the second filter 30B and an end part E3 of the third filter 32 cover the end part of the first filter 30A. In other words, by changing the distance d, the degree of the coverage can be controlled. The semiconductor device 10 of this embodiment is manufacture through the processes described above.

Since end portions of the second and third filters 30B, 32 overlap the end portion of the first filter 30A, the blue and violet lights can be prevented from entering the first photo-diode 80A and the second photo-diode 80B. Furthermore, increasing the distance d can prevent water from entering the semiconductor device 10 through the interface between the first filter 30A and the inter-layer insulating film 28, and the interface between the second filter 30B and the inter-layer insulating film 28, which can improve long-term reliability of the semiconductor device 10.

As described above in detail, the photo-diode 80A in the semiconductor device 10 detects the entire amount of UV, and the photo-diode 80B detects only UV-B out of the UV light. This makes it possible to separate UV-A from UV-B more appropriately, and to detect the radiation amount of UV-B more accurately.

Modification Example of Embodiment 1

A modification example of Embodiment 1 described above will be explained with reference to FIG. 7.

In Embodiment 1 above, the first filter 30A and the second filter 30B are a PB cut filter, and the third filter 32 is a UV-A cut filter, but the present invention is not limited to this example. The combination of the properties of the first filter 30A, the second filter 30B, and the third filter 32 may be changed as shown in FIG. 7. Below, the combination of the properties of the first filter 30A, the second filter 30B, and the third filter 32 will be referred to as the property (the property of the first filter 30A, the property of the second filter 30B, and the property of the third filter 32).

Mode 1 shown in FIG. 7 is the same combination of the filter properties as Embodiment 1, or in other words, the combination of the filter properties is Property (PB cut, PB cut, and UV-A cut).

In Mode 2, the combination of the filter properties is Property (PB cut, UV-A cut, PB cut). In Mode 3, the combination of the filter properties is Property (UV-A cut, UV-A, cut, PB cut). In Mode 4, the combination of the filter properties is Property (UV-A cut, PB cut, UV-A cut).

The filters of Mode 2 and Mode 4 can be manufactured by selecting an appropriate multi-film filter corresponding to each mode in the processes to form the first filter film 34 in FIG. 5B, and to form the second filter film and the third filter film 40 of FIG. 6C.

Embodiment 2

A semiconductor device 60 of this embodiment will be explained with reference to FIG. 8. The semiconductor device 60 differs from the semiconductor device 10 (see FIG. 1) in the configuration of the filter group (PB cut filter, UV-A cut filter).

Figure 8:
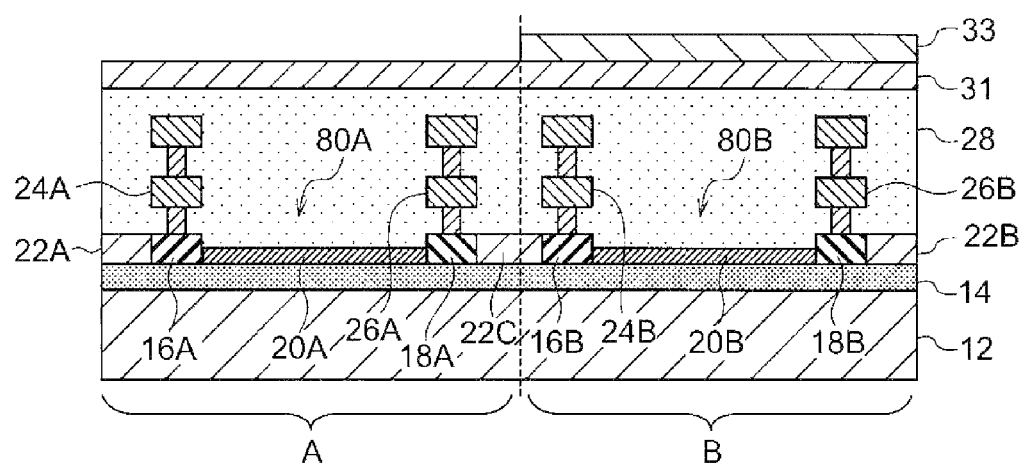
FIG. 8 is a vertical cross-sectional view showing an example of the configuration of a semiconductor device of Embodiment 2.

As shown in FIG. 8, the semiconductor device 60 includes a substrate 12, a buried oxide film 14, the first photo-diode 80A, the second photo-diode 80B, a P-side wiring layer 24A, an N-side wiring layer 26A, a P-side wiring layer 24B, an N-side wiring layer 26B, and an inter-layer insulating film 28. The configurations above are the same as those of the semiconductor device 10, and therefore, the same configurations are given the same reference characters, and the detailed descriptions thereof are omitted.

As shown in FIG. 8, the semiconductor device 60 includes the first filter 31 and the second filter 33 instead of the first filter 30A, the second filter 30B, and the third filter 32 of the semiconductor device 10. In this embodiment, the first filter 31 is a PB cut filter, and the second filter 33 is a UV-A cut filter. That is, in the semiconductor device 60, the PB cut filter, which was separately provided as the first filter 30A and the second filter 30B in the semiconductor device 10, is formed integrally as the first filter 31. Even when the filter group has such a structure, the first photo-diode 80A of the semiconductor device 60 receives the entire UV light, and the second photo-diode 80B receives only UV-B out of the UV light.

Thus, with the semiconductor device 60 of this embodiment as well, it is possible to separate UV-A from UV-B more appropriately and detect the radiation amount of UV-B more accurately. Furthermore, the semiconductor device 60 of this embodiment has the effect of easy manufacturing because the first filter 30A and the second filter 30B are provided as the integrally formed first filter 31.

Embodiment 3

Figure 9A:
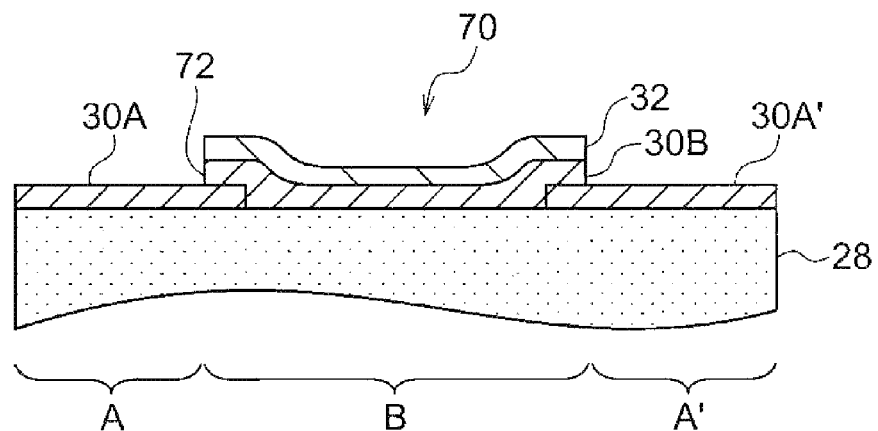
FIGS. 9A and 9B are vertical cross-sectional views and a plan view showing an example of the configuration of a semiconductor device of Embodiment 3.

A semiconductor device 70 of this embodiment will be explained with reference to FIG. 9. The semiconductor device 70 differs from the semiconductor device 10 (see FIG. 1) in the location of the filter group (PB cut filter, UV-A cut filter). FIG. 9A is a vertical cross-sectional view of the semiconductor device 70, and FIG. 9B is a plan view of the semiconductor device 70.

As shown in FIG. 9A, the area A where the first photo-diode 80A is to be formed is divided into the area A and the area A' in the cross-sectional view, and the area B where the second photo-diode 80B is to be formed is disposed between the area A and the area A'. Corresponding to the area A and the area A', the first filter 30A is divided into the first filter 30A and the first filter 30A' in the cross-sectional view. The second filter 30B is formed on the interlayer insulating film 28 so as to be in contact with the first filters 30A and 30A'. The third filter 32 is formed on the second filter 30B.

Figure 9B:
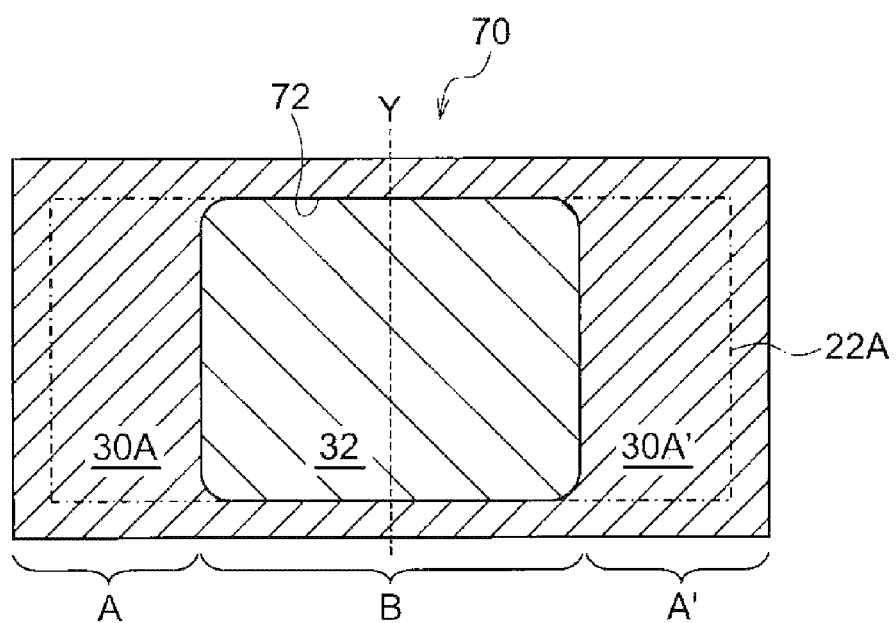

As shown in FIG. 9B, in the semiconductor device 70, portions 72 of the third filter 32 and the second filter 30B are removed to expose the first filters 30A and 30A'. The imaginary line Y shown in FIG. 9B schematically indicates the boundary line that divides the first filter into the area A and the area A'. The first filters 30A and 30A' and the second filter 30B are a PB cut filter made of a multi-layer film filter, and the third filter 32 is a UV-A cut filter made of a multi-layer film filter.

In the semiconductor device 70 having such a configuration, the photo-diode 80A detects the entire amount of UV light, and the photo-diode 80B detects only UV-B out of the UV light. Thus, with the semiconductor device 70 as well, it is possible to separate UV-A from UV-B more appropriately and detect the radiation amount of UV-B more accurately. Furthermore, with the semiconductor device 70 of this embodiment, the degree of freedom in the locations to form the first photo-diode 80A and the second photo-diode 80B in a semiconductor device improves.

Embodiment 4

A semiconductor device of this embodiment will be explained with reference to FIG. 10. This embodiment differs from the respective embodiments described above in the film structure of the multi-film filter of the filter group. The configuration of the semiconductor device other than the multi-film filter is the same as that of each embodiment above, and therefore, the description of the semiconductor device other than the multi-film filter will be omitted.

Figure 10A:
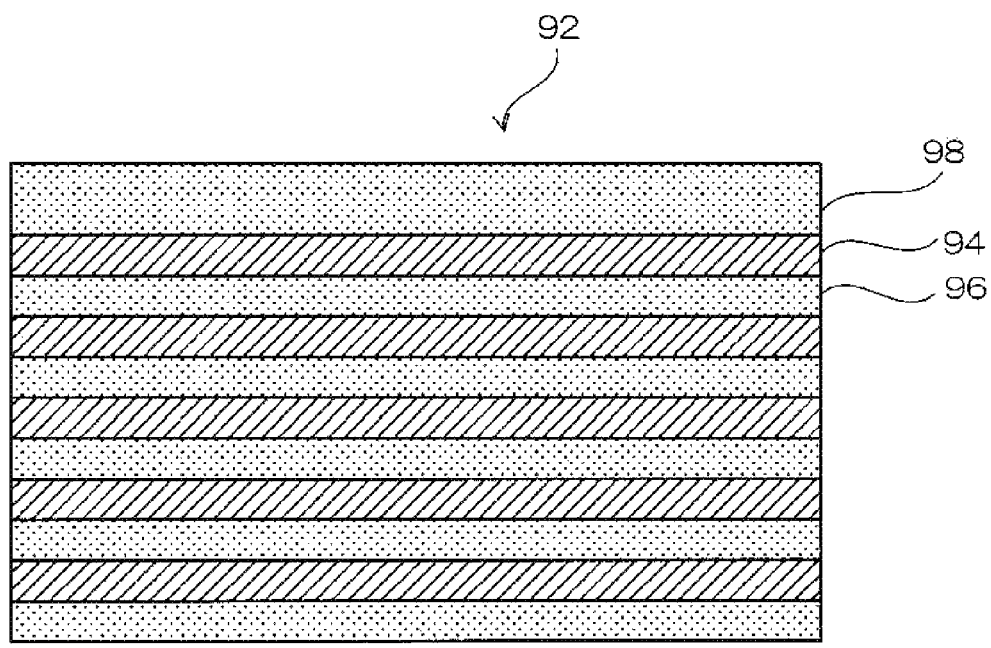
FIG. 10A is a cross-sectional view showing the configuration of a filter in a semiconductor device of Embodiment 4.

FIG. 10A is a cross-sectional view of a fourth filter 92 of this embodiment. The four filter 92 replaces at least one of the first filter 30A and the third filter 32 of the semiconductor device 10 of FIG. 1, the second filter 33 of FIG. 8, or at least one of the first filter 30A (30A') and the third filter 32 of FIG. 9. As shown in FIG. 10A, the fourth filter 92 includes a thick layer 98 in addition to a prescribed number of pairs of the high refractive index films 94 and the low refractive index films 96 (five pairs in FIG. 10A, for example). The thick layer 98 is thicker than the high refractive index films 94 and the low refractive index films 96.

The thick layer 98 is preferably 2 to 2.5 times as thick as the high refractive index films 94 and the low refractive index films 96. For example, when the high refractive index film 94 is approximately 45 nm, and the low refractive index film 96 is approximately 40 nm, the thickness of the thick layer 98 may be set to approximately 100 nm, for example.

It is preferable that the thick layer 98 have the same refractive index as that of the low refractive index film 96. That is, the thick layer 98 can be formed of the same silicon oxide film as the low refractive index film 96. As shown in FIG. 10A, the thick layer 98 is preferably disposed at the uppermost part of the fourth filter 92 (or in other words, the edge part of the light incident side).

The fourth filter 92 having the configuration described above may be a part of the UV-A cut filter or the PB cut filter in each embodiment above. Needless to say, the fourth filter 92 can be a part of the UV-B cut filter that cuts UV-B as necessary. By having the thick layer 98, the fourth filter 92 can have an improved blocking property against UV-A (transmittance property against UV-B), or an improved blocking property against UV-B (transmittance property against UV-A) as compared with the filters in each embodiment above not having the thick layer 98.

Figure 10C:
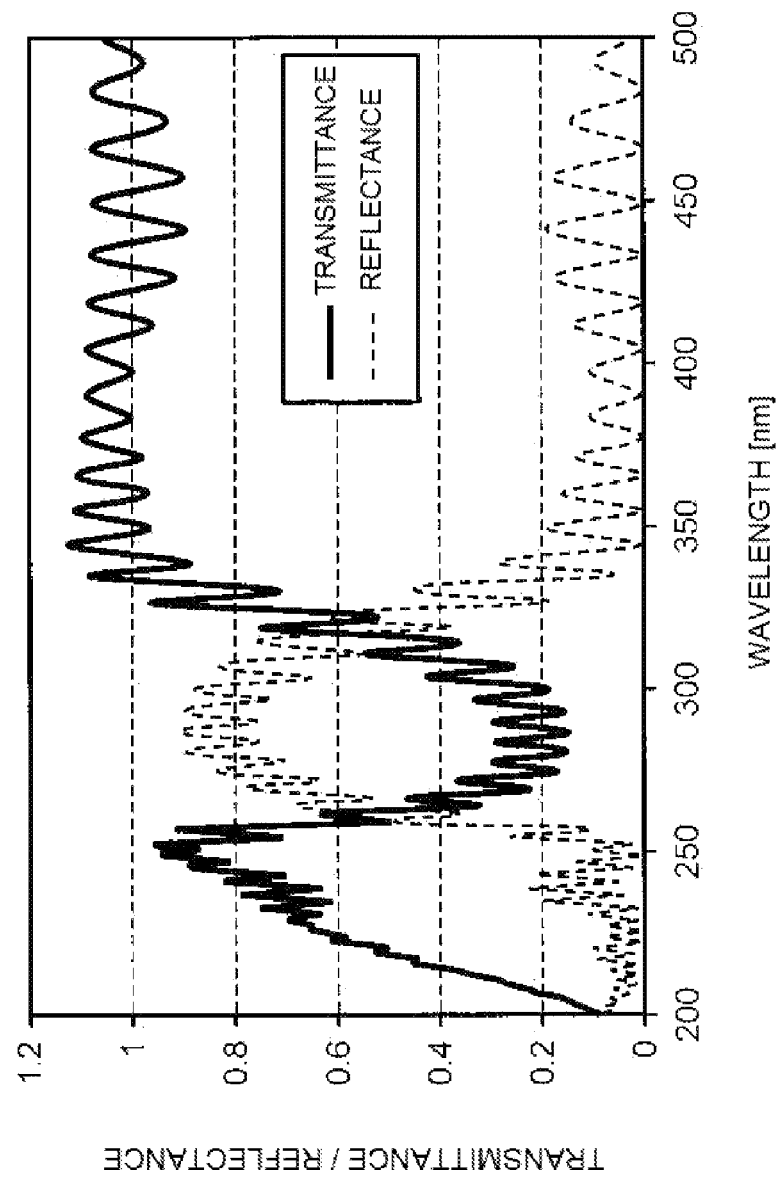

Below, the characteristics of the fourth filter will be explained based on the example of the UV-B cut filter (UV-A transmitting filter). FIG. 10B is a graph showing the simulation results of the wavelength characteristics of the transmittance and reflectance of the filters of a comparison example, which do not have the thick layer 98. On the other hand, FIG. 10C is a graph showing the simulation results of the wavelength characteristics of the transmittance and reflectance of the UV-A transmitting filter using the fourth filter 92 of Embodiment 4, which does have the thick layer 98. In both FIG. 10B and FIG. 10, the thickness of the high refractive index film 94 was 45 nm, the thickness of the low refractive index film 96 was 40 nm, the refractive index of the high refractive index film 94 was 1.8, and the refractive index of the low refractive index film 96 was 1.4. The thickness of the thick layer 98 was 100 nm, and the refractive index of the thick layer 98 was 1.4, which is the same as that of the low refractive index film 96. The thick layer 98 was disposed at the uppermost part of the fourth filter 92 (the edge part of the light incident side).

As shown in FIG. 10B, with the filter of the comparison example that does not have the thick layer 98, the transmittance gets lower around the wavelength 400 nm, which is the wavelength range of UV-A (part indicated with the arrow D in FIG. 10B), and the reflectance in this wavelength range is at least 0.3. On the other hand, as shown in FIG. 10C, with the fourth filter 92 that has the thick layer 98, the transmittance does not get lower around the wavelength 400 nm, which is the wavelength range of UV-A, and the reflectance in this wavelength range is 0.1 or less. As described above, with the fourth filter 92 having the thick layer 98, it is possible to improve the transmittance property for UV-A as compared to the filter of the comparison example that does not have the thick layer 98.

In each of the embodiments described above, the PB cut filter that cuts off primarily the blue and violet lights was explained as an example of the filter that cuts off light of a visible wavelength, but the present invention is not limited to this, and the filter may be configured so as to cut off visible light in a longer wavelength range, for example.

What is claimed is:

1. A semiconductor device, comprising:
   a first photo-electric conversion element and a second photo-electric conversion element disposed adjacent to each other, the first photo-electric conversion element and the second photo-electric conversion element each outputting a light current that is a current corresponding to an intensity of received light, each of the first and second photo-electric conversion elements having a light-receiving surface;
   a first filter disposed on the light-receiving surface of the first photo-electric conversion element;
   a second filter disposed on the light-receiving surface of the second photo-electric conversion element; and
   a third filter disposed on the light-receiving surface of the second photo-electric conversion element and being in contact with the second filter, one end of the second filter and one end of the third filter overlapping one end of the first filter at a vicinity of a boundary between the first photo-electric conversion element and the second photo-electric conversion element.

2. The semiconductor device according to claim 1, wherein at least one of the first filter, the second filter, and the third filter is made of a multi-layer film having a high refractive index film and a low refractive index film laminated alternatively, the high refractive index film and the low refractive index film having different refractive indexes from each other.

3. The semiconductor device according to claim 2, wherein the third filter is disposed above the second filter and is made of a multi-layer film, the third filter having a thick layer that has a same refractive index as one of the high refractive index film and the low refractive index film and has a thickness greater than that of both the high refractive index film and the low refractive index film.

4. The semiconductor device according to claim 3, wherein the thick layer is disposed at an uppermost layer of the third filter.

5. The semiconductor device according to claim 4, wherein the thick layer has the same refractive index as a refractive index of the low refractive index film.

6. The semiconductor device according to claim 1, wherein
   the first filter and the second filter are configured to block light of a first wavelength range, and
   the third filter is configured to block light of a second wavelength range different from the first wavelength range.

7. The semiconductor device according to claim 6, wherein the first wavelength range and the second wavelength respectively correspond to a wavelength range of visible light and a wavelength range of long-UV light, or the wavelength range of long-UV light and the wavelength range of visible light.

8. The semiconductor device according to claim 1, further comprising an interlayer insulating film formed on the first photo-electric conversion element and the second photo-electric conversion element each having a light-receiving surface, wherein
   the first filter is disposed above the light-receiving surface of the first photo-electric conversion element through the interlayer insulating film, and
   the second filter and the third filter are disposed above the light-receiving surface of the second photo-electric conversion element through the interlayer insulating film.

9. The semiconductor device according to claim 1, the second filter and the third filter each have an opening to expose the first filter.

10. A semiconductor device, comprising:
    a first photo-electric conversion element and a second photo-electric conversion element, each having a light-receiving surface, disposed adjacent to each other, the first photo-electric conversion element and the second photo-electric conversion element each outputting a light current that is a current corresponding to an intensity of received light;
    a first filter disposed on the light-receiving surface of each of the first photo-electric conversion element and the second photo-electric conversion element, the first filter being configured to block light of a first wavelength range; and
    a second filter disposed on the first filter above the light-receiving surface of the second photo-electric conversion element, the second filter being configured to block light of a second wavelength range different from the first wavelength.

11. A method of manufacturing a semiconductor device, comprising:
    forming, on a substrate, a first photo-electric conversion element and a second photo-electric conversion element, each having a light-receiving surface, disposed adjacent to each other, the first photo-electric conversion element and the second photo-electric conversion element each outputting a light current that is a current corresponding to an intensity of received light;
    forming a first filter on the light-receiving surface of the first photo-electric conversion element; and
    forming a second filter and a third filter on the light-receiving surface of the second photo-electric conversion element such that one end of the second filter and one end of the third filter overlapping one end of the first filter at a boundary between the first photo-electric conversion element and the second photo-electric conversion element.

12. The manufacturing method of a semiconductor device according to claim 11, wherein the forming the second filter and the third filter includes forming a resist mask on the first filter so as to recess from the one end of the first filter by a prescribed distance, and conducting a lift-off process to remove the resist.

* * * * *